US012804803B2

(12) United States Patent
Wieters et al.

(10) Patent No.: US 12,804,803 B2
(45) Date of Patent: Nov. 17, 2026

(54) ENDOSCOPE, PRINTED CIRCUIT BOARD OF AN ENDOSCOPE, AND METHOD FOR ELECTRICALLY CONNECTING A PRINTED CIRCUIT BOARD TO A STRUCTURAL ASSEMBLY

(71) Applicant: Olympus Winter & Ibe GmbH, Hamburg (DE)

(72) Inventors: Martin Wieters, Barsbuettel (DE); Sebastian Jungbauer, Hamburg (DE); Mathias Laser, Hamburg (DE); Alexander Herber, Hamburg (DE); Timo Pfander, Hamburg (DE); Stefan Rau, Hamburg (DE); Jens Schnitger, Glinde (DE)

(73) Assignee: OLYMPUS Winter & Ibe GmbH, Hamburg (DE)

( * ) Notice: Subject to any disclaimer, the term of this patent is extended or adjusted under 35 U.S.C. 154(b) by 219 days.

(21) Appl. No.: 18/583,118

(22) Filed: Feb. 21, 2024

(65) Prior Publication Data

US 2024/0292524 A1 Aug. 29, 2024

Related U.S. Application Data

(60) Provisional application No. 63/447,691, filed on Feb. 23, 2023.

(51) Int. Cl.

*H05K 1/02* (2006.01)
*H05K 1/11* (2006.01)
*H05K 3/36* (2006.01)

(52) U.S. Cl.

CPC ........... *H05K 1/0271* (2013.01); *H05K 1/112* (2013.01); *H05K 3/36* (2013.01); *H05K 2201/10121* (2013.01)

(58) Field of Classification Search

CPC ........ H05K 1/0271; H05K 1/112; H05K 3/36; H05K 2201/10121; H05K 2201/068;
(Continued)

(56) References Cited

U.S. PATENT DOCUMENTS 4,855,872 A 8/1989 Wojnar et al.
6,122,171 A 9/2000 Akram et al.
(Continued)

FOREIGN PATENT DOCUMENTS

DE 11 2010 000 032 T5 7/2012
DE 10 2011 054 105 A1 4/2013
DE 10 2015 220 825 A1 4/2017

OTHER PUBLICATIONS

German Search Report dated Nov. 15, 2023 received in 10 2023 104 557.1.

*Primary Examiner* — Timothy J Thompson

(74) *Attorney, Agent, or Firm* — Scully, Scott, Murphy & Presser, P.C.

(57) ABSTRACT

An endoscope including a printed circuit board. The printed circuit board comprising at least two contact points for electrically connecting the printed circuit board, by solder, to a structural assembly. Wherein the contact points are arranged on first and second opposing edges of the first printed circuit board and the printed circuit board comprising an expansion gap arranged between the at least two contacting points and the first and second opposing edges. Furthermore, a method for electrically connecting the printed circuit board of an endoscope to a structural assembly is disclosed.

8 Claims, 2 Drawing Sheets

(58) Field of Classification Search
CPC .......... H05K 2201/09063; H05K 2201/09181; H05K 5/363; H05K 1/118; A61B 1/051
See application file for complete search history.

(56) References Cited

U.S. PATENT DOCUMENTS

| | | | | |
|---|---|---|---|---|
| 7,300,397 | B2 * | 11/2007 | Adler | A61B 1/00114 600/920 |
| 8,749,989 | B1 * | 6/2014 | Kaylie | H05K 1/09 361/768 |
| 9,538,636 | B1 * | 1/2017 | Weigand | H01L 23/14 |
| 2008/0166577 | A1 * | 7/2008 | Nishidate | H05K 3/363 428/544 |
| 2010/0232115 | A1 | 9/2010 | Murakami et al. | |
| 2022/0377901 | A1 * | 11/2022 | Naeve | H05K 1/183 |

* cited by examiner

ENDOSCOPE, PRINTED CIRCUIT BOARD OF AN ENDOSCOPE, AND METHOD FOR ELECTRICALLY CONNECTING A PRINTED CIRCUIT BOARD TO A STRUCTURAL ASSEMBLY

CROSS-REFERENCE TO RELATED APPLICATION

The present application is based upon and claims the benefit of priority from U.S. Provisional Application No. 63/447,691 filed on Feb. 23, 2023, the entire contents of which is incorporated herein by reference.

BACKGROUND

Field

The present disclosure relates to an endoscope and more particularly to an endoscope comprising a printed circuit board, the printed circuit board comprising at least two contact points for electrically contacting the printed circuit board and configured to be soldered to a structural assembly, the contact points further being arranged on two opposing edges of the printed circuit board.

Prior Art

Over the past decades, endoscopes have evolved from what were initially simple optical viewing devices to highly sophisticated tools designed for their specific purpose. In the course of this development, they have been expanded in their range of functions, resulting in further and improved treatment options. As a result, endoscopes today include not only opto-mechanical components but also electrical and electronic elements, e.g., video sensors, which must be supplied with electrical energy, receive configuration data, and whose data must be read out. For these tasks printed circuit boards (PCB) have proven useful.

Printed circuit boards (PCB) are components used in practically all electronic devices providing means to electrically connect electronic components and support them mechanically. They are manufactured comprising electrically conductive traces for guiding electrical energy and/or signals to or from the electronic components and electrical contact points electrically linking the PCB to further electric or electronic assemblies.

PCBs may be rigid or flexible. While rigid PCBs often comprise a laminated sandwich structure of conductive and insulating layers, flexible electronics refers to the use of flexible plastic substrates for carrying components and conductive traces.

Due to their case of manufacture, small required space and easy adaptability to components intended for use, PCBs find application where optimized space utilization is of importance or where a movement of different components relative to each other takes place. For example, within endoscopic shaft tubes, which are designed to occupy little space, flexible and rigid PCBs are used in order to connect sensors disposed in the distal tip of the shaft to external supply and control devices.

However, in such assemblies, it may be necessary to use different PCBs to satisfy the design requirements and accommodate the electronic components intended to be used. For example, it may be necessary to arrange a particular endoscopic sensor on a rigid PCB, while a flexible PCB is suitable for supplying electrical power to the sensor because of the little space required. As a result, different PCBs must be electrically connected to each other.

An electrical connection between two PCBs can be established by soldering. Solder applied to contact points or contact pads disposed on the involved PCB enables the electrical communication and creates a mechanical bond between the PCB. The number of solder points applied is equivalent to the number of electrical contacts which need to be established between the PCBs. However, problems may arise where a combination of PCBs made from different types of material are used. As different materials may comprise different coefficients of thermal expansion (CTE), different thermal expansions at a given temperature change may cause stress within the PCBs and especially at the soldering points. The effect is more severe where the difference in the CTE between the pair of PCB used is large and/or where occurring changes in temperature are high.

As a consequence, repeated application of stresses due to thermal expansion may result in degradation and wear of the soldering connections. For endoscopes undergoing reprocessing, where they are subjected to superheated steam at high pressure, at a certain point, the electrical connection may be damaged or permanently lost.

SUMMARY

Therefore, an object of the present disclosure is to provide an improvement with respect to the above-mentioned problems.

According to a first aspect of the disclosure, such object can be achieved by an endoscope comprising a printed circuit board, the printed circuit board comprising at least two contact points for electrically contacting the printed circuit board and configured to be soldered to a structural assembly, the contact points further being arranged on two opposing edges of the printed circuit board. Wherein the printed circuit board comprising an expansion gap arranged between the at least two contacting points and the two opposing edges.

The additional provision of the expansion gap can at least partially relieve the contact points from the forces occurring in reaction to thermal expansion. As the PCB can be used in combination with a structural assembly with at least two mechanical bonds mechanical stress arises with changes in temperature. This can be the case when the PCB and the structural assembly comprise substantially different CTEs or at high changes in temperature. Depending on these factors, stresses can arise due to tension or compression between the contact points. The expansion gap, which can be arranged between the contact points and in the line of action of the resulting forces acting on the contact points, can alleviate the loads on the joints and consequently can reduce the danger of damaging the joints.

Instead of resulting in elastic stress or buckling, the material of the PCB can expand or contract while the expansion gap narrows or widens. The expansion gap can be arranged in any direction as long as its arrangement allows thermal expansion to cause the gap to narrow and thermal contraction to cause the gap to widen, or vice versa. The expansion gap can for example be arranged substantially parallel to one or both of the opposing edges. Alternatively, the expansion gap can be arranged at an angle to one or both of the opposing edges. The expansion gap can be straight, bent, curved or of any other shape.

The effect can be achieved both with rigid and flexible PCBs. While at least two contact points can cause stresses which can be alleviated by arranging the expansion gap between them there may be more than two contact points disposed on the PCB. For example, a plurality of contact points may be arranged on the first of the two opposing edges and or on the second of the two opposing edges. There may be the same or a different number of contact points arranged on the two opposing edges. Contact points may also be arranged in a symmetrical arrangement meaning that the number of contact points on each of the opposing edges can be identical and that the contact points can be arranged along the edges symmetrically with respect to the geometry of the PCB.

The opposing edges can be placed opposite each other in the sense that they can run parallel to each other. However, they may also run at an angle to each other and may even meet, so that they can also be opposing in the sense that a section of the PCB lies between the edges. The edges can be straight. The edges can also be arranged in a curved, bent or kinked shape.

The structural assembly can be any sort of structure to which a printed circuit board within an endoscope may typically be soldered. The structural assembly may be a single element, e.g. another rigid or flexible PCB. The structural assembly may alternatively be an assembly of more than one element, e.g. a sensor comprising more than one contact pad or board for contacting. In the latter case, the structural assembly may comprise a combined CTE along a direction of expansion and/or retraction, for example along the direction defined by the at least two contact points, wherein the combined CTE represents a single value containing the combined and interacting effects of thermal expansion of the single components forming the structural assembly.

In some embodiments of an endoscope according to the present disclosure, the contact points may be configured as cut vias on the two opposing edges of the printed circuit board configured to be soldered to the structural assembly. As is known to the person skilled in the art, vias are through-holes in the thickness direction of the PCB plated with a conductive metal. They are sufficiently easy to manufacture, provide a comparably large area to apply solder when being cut by the edge and can be disposed on the PCB as to establish electrical contact to one or more of the electrically conductive traces formed on the PCB.

The expansion gap may extend from an outer edge into the printed circuit board and in the area between the two opposing outer edges and the contact points. Accordingly, the expansion gap can be easy to manufacture. Furthermore, loads on the solder resulting from the thermal expansion in the uncut region can be reduced to a greater degree.

In some embodiments of the endoscope according to the disclosure the expansion gap may be symmetrically arranged with respect to the two opposing outer edges. Such an arrangement can require the least manufacturing tolerances and can minimize the displacement of the PCB in the gap area with respect to the non-expanded position.

The two opposing edges may be outer edges of the printed circuit board. Thus, the contact points can be reached particularly well when soldering the PCB to the structural assembly. Gap width can be minimal in this configuration.

Alternatively, the two opposing edges may form the two edges of the expansion gap. Accordingly, the expansion gap can need a width sufficiently large to allow the application of solder to the individual contact points. Arranging the opposing contact points closer together can minimize the overall differences in thermal expansion between the contact points and, can consequently, reduce stress in proximate un-cut regions of the PCB.

The expansion gap may end in a hole. As thermal expansion can occur both in cut and un-cut regions of the PCB, tensile stresses may arise especially in the transition region where the cut ends. The hole may prevent forming and further propagation of cracks in the direction of the gap.

Alternatively, holes may be arranged in the inner corners of the expansion gap. This can be particularly useful for wider gaps. Again, the probability of crack formation and propagation can be reduced by this measure.

According to a second aspect of the disclosure, such object can be achieved by a method for electrically connecting a printed circuit board of an endoscope to a structural assembly comprising: providing a first printed circuit board according to the first aspect of the disclosure; providing a structural assembly, wherein the structural assembly comprises a plurality of contact pads corresponding to the at least two contact points of the first printed circuit board; aligning the first printed circuit board and the structural assembly such that the contact points of the first printed circuit board are in contact with the contact pads of the structural assembly; and soldering the contact points with the corresponding contact pads.

As for the achievable effects with respect to the configuration of the first PCB, reference is made to the above-mentioned advantages, especially those regarding the alleviation of loads under thermal influence acting on the soldering points. The joint of the PCB and the structural assembly made according to this aspect can be less susceptible to degradation and damage of the solder subjected to repeated temperature changes. At the same time, the familiar manual process steps for joining the two PCBs in the conventional way can be retained.

Again, the structural assembly can be any sort of structure to which a printed circuit board within an endoscope may be typically soldered. The structural assembly may be a single element, e.g. another rigid or flexible PCB. The structural assembly may alternatively be an assembly of more than one element, e.g. a sensor comprising more than one contact pad or board for contacting. In the latter case, the structural assembly may comprise a combined CTE along a direction of expansion and/or retraction, for example along the direction defined by the at least two contact points, wherein the combined CTE represents a single value containing the combined and interacting effects of thermal expansion of the single components forming the structural assembly.

In further embodiments, the first printed circuit board and the structural assembly may comprise different coefficients of thermal expansion. The extent of the advantageous effect increases with the difference in CTE between the first PCB and the structural assembly.

According to some embodiments, the first printed circuit board may comprise a higher coefficient of thermal expansion than the structural assembly.

The expansion gap of the first printed circuit board may have at least the same width as the difference in thermal expansion at the highest temperature range the pair of first printed circuit board and structural assembly is subjected to. With such a width it is possible that at no point during normal operation the gap is completely closed. Instead, thermal expansion can always take place utilizing the space in the expansion gap without applying excessive forces on the solder points.

At least one of the first printed circuit board or the structural assembly may be configured to guide electrical signals within the endoscope.

The illustrated method according to the present disclosure may be particularly suitable for solder joints within endoscopes. Endoscopes, as they are reprocessed, are exposed to high temperatures required for sterilization. The reprocessing being performed between each use of the endoscope causes repeated thermal expansion causing loads on the solder joints. In this context, electrical signals are understood to include both the provision of electrical energy to supply electrical or electronic components and analogue or digital information, for example for transmitting a video signal or other sensor quantities.

Further, the structural assembly may be a second printed circuit board. The method may then be applied to joints where in an endoscope a single PCB cannot be used, e.g. due to design requirements regarding a maximum allowable CTE of one of the components.

An imager chip comprising silicon may be mounted on the second printed circuit board. Such an imager chip, having a low CTE itself, may only be mounted to a PCB of comparably low CTE, for example made from ceramics with a CTE of around 10*10^(−6) [1/K]. Still, according to the present disclosure, a soldered connection to a flexible PCB especially suitable for guiding electrical signals along the length of an elongated shaft of an endoscope can be formed without risking damage to the soldering points due to thermal loads. Flexible PCB for example made from polyimide typically have higher CTE of around 25*10^(−6) [1/K].

BRIEF DESCRIPTION OF THE DRAWINGS

The embodiments are described below with reference to a number of figures, the figures being illustrative in nature and intended to aid understanding of the embodiments without limiting them. Where applicable, the figures are not to be understood as a representation to scale of the claimed devices and systems.

In the figures.

DETAILED DESCRIPTION

Figure 1:
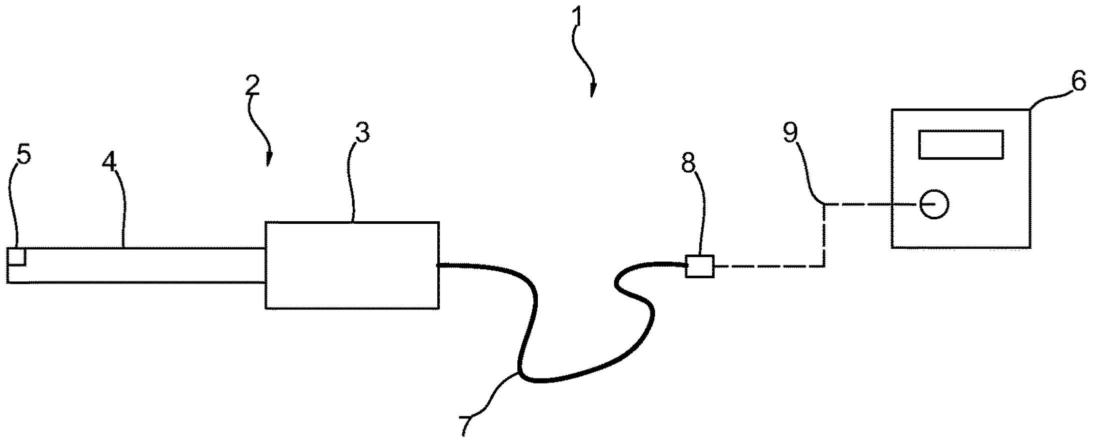
FIG. 1 illustrates an endoscopic system comprising an endoscope.

FIG. 1 is an illustration of an endoscopic system 1 in which an endoscope 2 according to the present disclosure can be operated. The endoscope 2 comprises a main body 3 and an elongated shaft 4. During a medical intervention the elongated shaft 4 is introduced into a body cavity of a patient in order to allow the physician to visually inspect an area of interest. For this purpose, an optical assembly 5 is disposed at the distal tip of the shaft 4 recording electronic images using an imager chip, such a CCD image sensor or a CMOS image sensor. Instead, or additionally, other sensors, for example thermometers, may be disposed in the endoscope 2, for example in the distal tip of the shaft 4.

During a procedure, the exemplary endoscope 2 including its sensors needs to be supplied with electrical energy, sometimes needs to receive configuration data, and the recorded sensor data is transmitted to external processing units. Energy supply and data exchange can for example be carried out by an electrical supply device 6. A connection between the endoscope 2 and the supply device 6 can be established via a cable 7 with a plug 8 configured to be connected to a corresponding socket of the supply device 6, as indicated by the dashed line 9. Additional cables, tubes and the like may be necessary to provide other means, e.g. illumination light or suction, to the endoscope. For the purpose of the present disclosure, tubes, cables, wires and the like for establishing contact with the supply infrastructure may form part of the endoscope. Especially, the endoscope may comprise elements, detachable and non-detachable, which undergo reprocessing together with the instrument itself.

Figure 2:
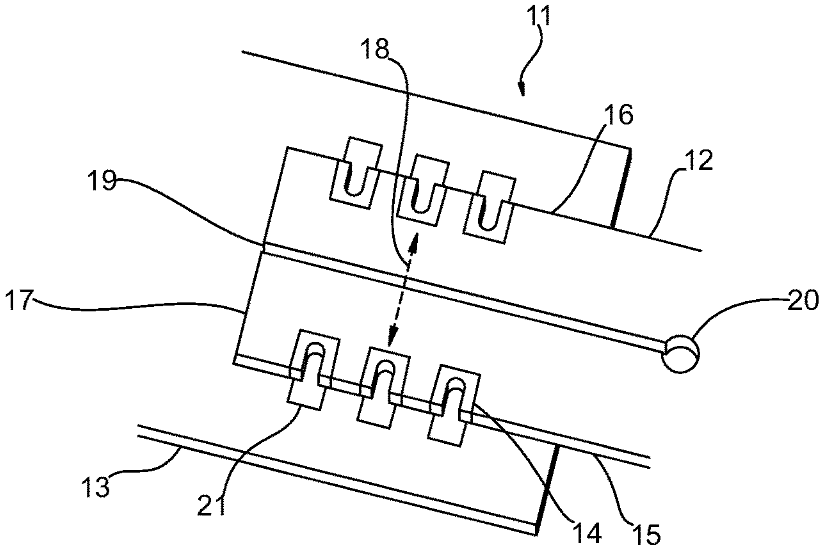
FIG. 2 illustrates a joint of a first PCB and a second PCB according to an embodiment of the disclosure.

FIG. 2 depicts an example of a joint 11 of a first PCB 12 with a structural assembly, such as a second PCB 13 manufactured according to the present disclosure. The joint 11 can for example be established in the endoscope 2 of FIG. 1. The first PCB 12 comprises a total of six contact points 14 equally distributed over a first edge 15 and a second edge 16. In this example, the first PCB 12 is a flexible PCB made from polyimide. Instead, it may also be made from a different material or selected to be rigid. While there are six contact points 14 shown, the first PCB 12 may also comprise a lower or a higher number of contact points as long as, according to the disclosure, there is a minimum total of two contact points disposed on at least two opposing edges. The contact points 14 do not necessarily need to be evenly distributed over the edges.

The opposing edges 15, 16 can be opposite each other in the sense that they run parallel to each other as depicted in FIG. 2. However, they can also be opposing in the sense that they run at an angle to each other and may even meet, so that a section of the PCB lies between the edges. For example, instead of disposing contact points on edge 15, contact points may additionally or alternatively also be disposed on a distal edge 17. The edges 15, 16, 17 can be straight as shown. The edges can also be arranged in a curved, bent or kinked shape.

In the example of FIG. 2, contact points 14 are configured as vias cut by the opposing edges 15, 16, also known as edge-vias, edge plating or castellation, and configured to be soldered to the second PCB 13. As is known to the person skilled in the art, vias are through-holes in the thickness direction of the PCB plated with a conductive metal in order to establish electrical contact to one or more of electrically conductive traces formed on the PCB 12, for reasons of simplicity not shown in FIG. 2.

As the first PCB 12 is soldered to the second PCB 13 forming at least two mechanical bonds, mechanical stress arises with changes in temperature, in a direction indicated by arrow 18. This is especially the case when the PCB and the structural assembly comprise substantially different CTEs, and/or at high changes in temperature. Depending on these factors, stresses can arise due to tension or compression between the contact points. In order to alleviate such stresses, the first PCB 12 comprises an expansion gap 19. Therefore, the danger of damaging the joints by repeated changes in temperature is reduced. Instead of resulting in clastic stresses or buckling, the material of the first and second PCBs 12, 13 can expand or contract differently and narrow or widen the expansion gap. The expansion gap 19 can be arranged symmetrically with respect to and substantially parallel to one or both of the opposing edges 15, 16 as depicted in FIG. 2. Alternatively, the expansion gap can be arranged at an angle to one or both of the opposing edges. The expansion gap can be straight, bent, curved or of any other shape. Furthermore, in the embodiment of FIG. 2, the expansion gap 19 extends from an outer edge 17 into the flexible printed circuit board 12 and in the area between the two opposing outer edges 15, 16 and the contact points 14.

Such an embodiment is comparatively easy to manufacture. However, a gap may also be manufactured without touching an outer edge.

The expansion gap 19 of FIG. 2 ends in a hole 20. As thermal expansion occurs both in cut and un-cut regions of the PCB, tensile stresses may arise especially in the transition region where the gap 19 ends. The hole 20 can help to prevent formation and/or further propagation of cracks in the direction of the gap.

In this example, the expansion gap 19 of the first PCB 12 has a width wider than the difference in thermal expansion at the highest temperature range the pair of first PCB 12 and second PCB 13 is subjected to. With such a width it can be ensured that at no point during normal operation the gap 19 is completely closed. Instead, thermal expansion can always take place utilizing the space in the expansion gap 19 without applying excessive forces on the solder points.

The second PCB 13 comprises a plurality of contact pads 21 corresponding to the contact points 14 arranged on the first PCB 12. Electrical and mechanical connection between the contact points 14 and the contact pads 21 is established by soldering. In the embodiment of FIG. 2, the second PCB 13 is a rigid PCB. Instead, it may also be flexible. It may also be any other sort of structural assembly. It may also consist of more than one component and have a combined CTE, which is the interaction of the behaviour under thermal influence of the individual components, for example along the direction indicated by arrow 18.

Figure 3:
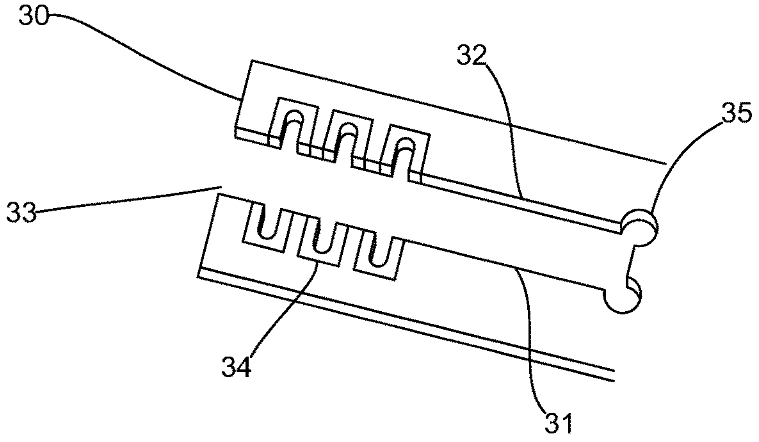
FIG. 3 illustrates an alternative embodiment of a PCB according to the disclosure.

FIG. 3 shows an alternative embodiment of a PCB 30 according to the disclosure. A second structural assembly as in FIG. 2 is not depicted here for reasons of simplicity. However, PCB 30 may of course also be used in a joint as shown in FIG. 2. In the following, the relevant differences to PCB 12 are explained while the above-said remains valid for PCB 30 as long as not stated otherwise.

In the embodiment of FIG. 3 two opposing edges 31, 32 form two edges of the expansion gap 33. Accordingly, the expansion gap needs a width sufficiently large to allow the application of solder to the individual contact points 34. In this case, thermal expansion occurs from the central expansion gap 33 outward in both directions.

Furthermore, holes 35 are arranged in the inner corners of the expansion gap 33. For wider gaps as realized in this embodiment, a single hole as in FIG. 2 may not be a feasible option. Again, the probability of crack formation and propagation is reduced by this measure.

Figure 4:
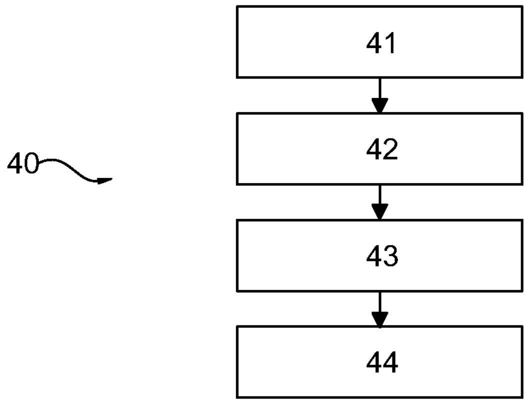
FIG. 4 illustrates a flowchart illustrating a method according to the present disclosure.

FIG. 4 shows a flowchart of a method 40 according to the disclosure for electrically connecting two PCB. First, at step 41, a first PCB is provided. The first PCB comprises at least two contact points for electrically contacting the PCB. Further, the contact points are arranged on two opposing edges of the first PCB. Also, an expansion gap is necessarily arranged between the at least two contacting points and the two opposing edges of the first PCB. PCB 12 and 30 of examples from FIGS. 2 and 3 represent possible examples of a PCB and may be used in method 40.

Then, at step 42, a structural assembly is provided. The structural assembly comprises a plurality of contact pads corresponding to the at least two contact points of the first printed circuit board. The structural assembly may be a single workpiece. Alternatively, the assembly may consist of more than one component and have a combined CTE, which is the interaction of the behaviour under thermal influence of the individual components, for example along the direction defined by the at least two contact points. A possible example for a structural assembly is the rigid PCB 13 of FIG. 2. A flexible PCB may also be used.

At step 43 the first PCB provided at step 41 and the structural assembly provided at step 42 are aligned such that the contact points of the first PCB are in contact with the contact pads of the structural assembly. Then, at step 44, the individual contact points and the corresponding contact pads are soldered in order to establish the mechanical bonding and the electrical connection. The connection of the first PCB and the structural assembly established according to this method is less sensitive to damage from temperature changes than known prior art processes.

While there has been shown and described what is considered to be embodiments of the invention, it will, of course, be understood that various modifications and changes in form or detail could readily be made without departing from the spirit of the invention. It is therefore intended that the invention be not limited to the exact forms described and illustrated, but should be constructed to cover all modifications that can fall within the scope of the appended claims.

The invention claimed is:

1. An endoscope comprising:

a printed circuit board comprising at least two contact points for electrically connecting the printed circuit board, by solder, to a structural assembly, wherein:

the contact points are arranged on first and second opposing edges of the printed circuit board, the printed circuit board forms an expansion gap between the contacting points and the first and second opposing edges, the expansion gap extends from a third edge into the printed circuit board and into an area between the first and second opposing edges and the contact points, a width of the expansion gap is configured to accommodate thermal expansion of portions of the printed circuit board surrounding the expansion gap at a highest temperature the printed circuit board may be subjected to, and the expansion gap terminates in a hole having a diameter larger than the width of the expansion gap.

2. The endoscope according to claim 1, wherein the contact points are configured as cut vias on the first and second opposing edges of the printed circuit board.

3. The endoscope according to claim 1, wherein the expansion gap is symmetrically arranged with respect to the first and second opposing edges.

4. The endoscope according to claim 1, wherein the first and second opposing edges are outer edges of the printed circuit board.

5. The endoscope according to claim 1, wherein the first and second opposing edges form first and second edges of the expansion gap.

6. The endoscope according to claim 1, wherein holes are arranged in the inner corners of the expansion gap.

7. The endoscope according to claim 1, wherein the printed circuit board is a first printed circuit board and the structural assembly comprises a second printed circuit board.

8. The endoscope according to claim 1, further comprising the structural assembly, wherein the printed circuit board and the structural assembly comprise different coefficients of thermal expansion.

* * * * *